(12) United States Patent
Linderer et al.

(10) Patent No.: US 6,455,406 B1
(45) Date of Patent: Sep. 24, 2002

(54) SEMICONDUCTOR PROCESSING METHOD OF FORMING A CONDUCTIVE CONNECTION THROUGH $W_xSi_yN_z$ MATERIAL WITH SPECIFIC CONTACT OPENING ETCHING

(75) Inventors: Richard Linderer, Boise, ID (US); Kelly Williamson, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/997,735

(22) Filed: Nov. 28, 2001

(51) Int. Cl.⁷ .......................................... H01L 21/4763
(52) U.S. Cl. .................. 438/592; 438/635; 438/706; 438/688
(58) Field of Search ................................ 438/592, 635, 438/637, 658, 688, 689, 652, 668, 700, 705, 706–710, 720–724, 591, 585, 396; 257/296, 309

(56) References Cited

U.S. PATENT DOCUMENTS

| | | | |
|---|---|---|---|
| 5,292,677 A | * 3/1994 | Dennison | ..................... 438/396 |
| 5,907,188 A | * 5/1999 | Nakajima et al. | ............ 257/751 |
| 6,249,015 B1 | * 6/2001 | Matsuo et al. | ............... 257/296 |
| 6,291,868 B1 | * 9/2001 | Weimer et al. | .............. 257/413 |

* cited by examiner

Primary Examiner—Olik Chaudhuri
Assistant Examiner—Yennhu B. Huynh
(74) Attorney, Agent, or Firm—Wells St. John P.S.

(57) ABSTRACT

A conductive structure includes a conductively doped semiconductive material and an overlying $W_xSi_yN_z$ comprising material, where each of "x", "y" and "z" is greater than zero. Insulative material is formed over the $W_xSi_yN_z$ comprising material of the conductive structure. A contact opening is etched through the insulative material and through the $W_xSi_yN_z$ material effective to expose the conductively doped semiconductive material. The contact opening etching includes at least one dry etch, followed by at least one wet etch, followed by at least one dry etch. At least one wet etch occurs before etching the $W_xSi_yN_z$ comprising material. After the contact opening etching, conductive material is formed within the contact opening in electrical connection with the conductively doped semiconductive material. Other aspects are disclosed.

38 Claims, 4 Drawing Sheets

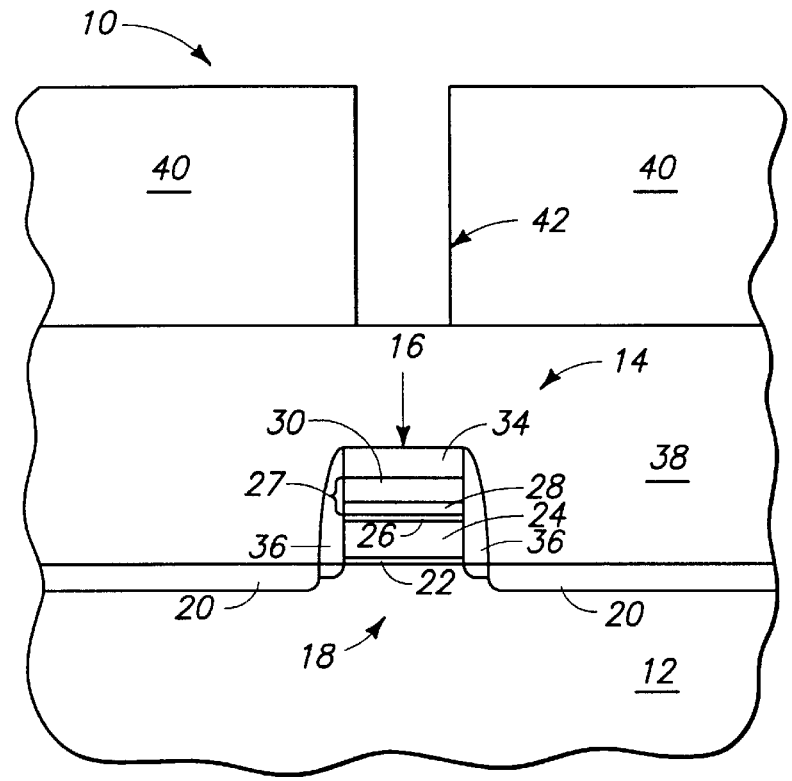
F I G 3
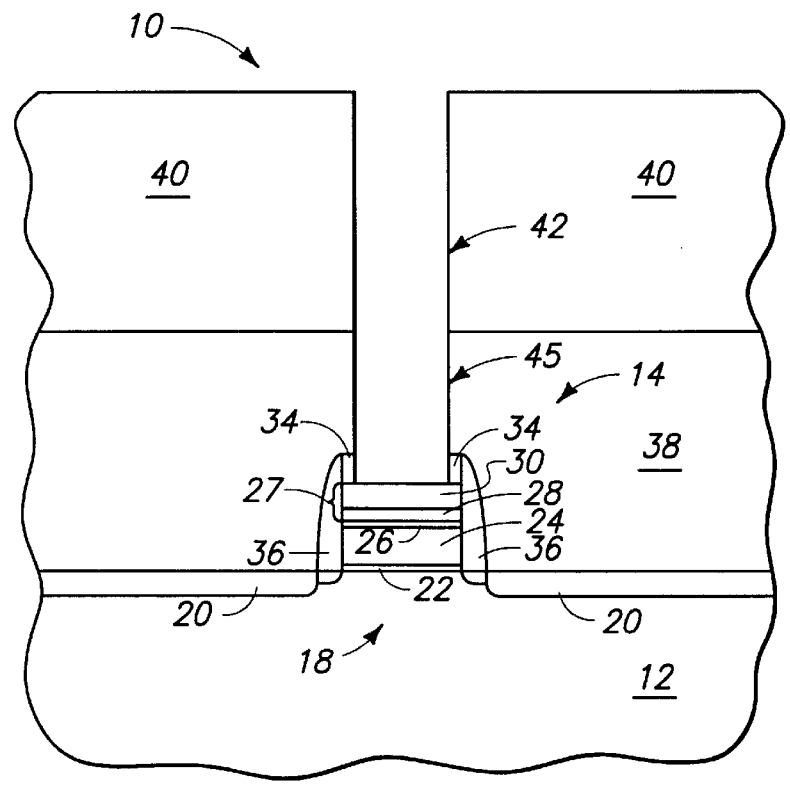
F I G 4

SEMICONDUCTOR PROCESSING METHOD OF FORMING A CONDUCTIVE CONNECTION THROUGH $W_xSi_yN_z$ MATERIAL WITH SPECIFIC CONTACT OPENING ETCHING

TECHNICAL FIELD

This invention relates to methods of forming conductive connections in semiconductor processing.

BACKGROUND OF THE INVENTION

Semiconductor wafer processing in the fabrication of integrated circuitry typically includes the formation of contact openings within insulating layers to underlying conductive structures. Currently, such processing is typically conducted by photolithography wherein a masking layer is deposited and a desired pattern of openings is formed therethrough. The masking layer is then used as a mask while chemical etching is conducted through the mask openings into the underlying insulative material to etch it largely selective to the masking layer. Thereby, the openings can be extended through the insulating material to the conductive structures therebeneath.

One type of existing conductive structure comprises a field effect transistor gate construction having an insulative silicon nitride cap which overlies a conductive elemental tungsten layer which overlies a conductive $WN_v$ layer which overlies a lesser conductive $W_xSi_yN_z$ layer which overlies a conductively doped polysilicon layer which overlies a gate dielectric layer. One or more insulating layers typically overlies such constructions. It is typically desirable to make conductive electrical connections to such structures, preferably completely through such layers to contact the conductively doped polysilicon.

The following invention was motivated in making electrical contacts to such constructions, although such is in no way so limited. The invention is limited only by the accompanying claims as literally worded without limiting reference to the specification, and in accordance with the doctrine of equivalents.

SUMMARY

The invention includes a semiconductor processing method of forming a conductive connection. In one implementation, a conductive structure is formed over a substrate, with the conductive structure including a conductively doped semiconductive material and an overlying $W_xSi_yN_z$ comprising material, where each of "x", "y" and "z" is greater than zero. Insulative material is formed over the $W_xSi_yN_z$ comprising material of the conductive structure. A contact opening is etched through the insulative material and through the $W_xSi_yN_z$ material effective to expose the conductively doped semiconductive material. The contact opening etching includes at least one dry etch, followed by at least one wet etch, followed by at least one dry etch. At least one wet etch occurs before etching the $W_xSi_yN_z$ comprising material. After the contact opening etching, conductive material is formed within the contact opening in electrical connection with the conductively doped semiconductive material.

In one implementation, a semiconductor processing method of forming a conductive connection includes forming a conductive structure over a substrate, with the conductive structure comprising a conductively doped semiconductive material and a conductive tungsten comprising material overlying the conductively doped semiconductive material. The conductive tungsten comprising material comprises at least one of elemental tungsten, a tungsten alloy, and $WN_v$, where "v" is greater than zero. Insulative material is formed over the conductive tungsten comprising material. A contact opening is etched into the insulative material to proximate the conductive tungsten comprising material. After etching the insulative material, the conductive tungsten comprising material is wet etched effective to extend the contact opening to therewithin. After the wet etching, conductive material is formed within the contact opening in electrical connection with the conductively doped semiconductive material.

BRIEF DESCRIPTION OF THE DRAWINGS

Preferred embodiments of the invention are described below with reference to the following accompanying drawings.

FIG. 3 is a view of the FIG. 2 wafer fragment at a processing step subsequent to that shown by FIG. 2.

FIG. 4 is a view of the FIG. 3 wafer fragment at a processing step subsequent to that shown by FIG. 3.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
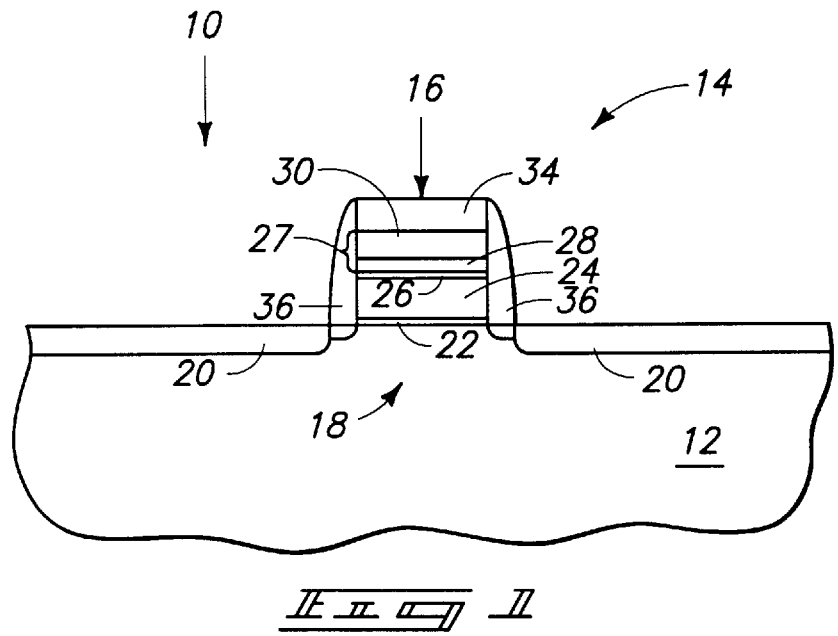
FIG. 1 is a diagrammatic perspective view of a semiconductor wafer fragment/section in process in accordance with an aspect of the invention.

Preferred embodiments of a semiconductor processing method of forming a conductive connection is described with reference to FIGS. 1–8. Referring initially to FIG. 1, a semiconductor wafer fragment 10 comprises a bulk monocrystalline silicon substrate 12 having a field effect transistor 14 formed thereon. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. Field effect transistor 14 comprises a transistor gate 16 which overlies a channel region 18 formed within substrate material 12. Source/drain regions 20 are provided on opposing lateral sides of gate construction 16. The intent in the exemplary processing is to make a conductive connection to gate construction 16. Gate construction 16 is but one example of a conductive structure which is formed over a substrate, with other conductive structures of course being contemplated in accordance with the accompanying claims as literally worded, without limiting reference to the specification, and as interpreted with the doctrine of equivalents.

Transistor gate construction 16 comprises a gate dielectric layer 22 received immediately over channel region 18 and a conductively doped semiconductive material region 24 received over region 22. An exemplary thickness range for region 22 is from 20 Angstroms to 100 Angstroms, with an exemplary thickness range for semiconductive material 24 being from 450 Angstroms to 700 Angstroms. An exemplary preferred material for region 24 is polysilicon conductively doped with a p-type or n-type impurity to yield a resistivity of from 50 to 100 ohms/cm$^2$. A $W_xSi_yN_z$ comprising material 26 overlies semiconductive material 24, with each of "x", "y" and "z" being greater than zero. Preferably and as shown, material 26 contacts material 24. Exemplary preferred ranges for "x", "y" and "z" are from 1 to 6, 1 to 6 and 1 to 2, respectively. Such a material can, and typically does, form from the reaction of an overlying material (described subsequently) with silicon of material 24 due to inherent thermal processing of the substrate. Exemplary preferred materials for $W_xSi_yN_z$ include $W_6Si_3N$ and $W_3Si_6N$. In one exemplary embodiment, the stoichiometry of such material varies throughout layer 26, with $W_6Si_3N$ being the majority-present material at the uppermost portion of layer 26 and $W_3Si_6N$ being the majority component closer to film 24. An exemplary thickness for material 26 is from 50 Angstroms to 150 Angstroms.

A conductive tungsten comprising material 27 overlies $W_xSi_yN_z$ comprising material 26. Conductive tungsten comprising material 27 comprises at least one of elemental tungsten, a tungsten alloy and $WN_v$ where "v" is greater than zero. In one preferred embodiment, "v" is from 1 to 3. In the depicted and preferred embodiment, conductive tungsten comprising material 27 comprises an elemental tungsten layer 30 received over and contacting a $WN_v$ comprising layer 28. An exemplary thickness range for layer 28 is from 75 Angstroms to 200 Angstroms, with an exemplary thickness for layer 30 being from 300 Angstroms to 400 Angstroms. Accordingly in such preferred embodiment, conductive tungsten comprising material 27 comprises both elemental tungsten and $WN_v$. Further in the illustrated and preferred embodiment, conductive tungsten comprising material 27 contacts the $W_xSi_yN_z$ comprising material. An insulative cap 34 is received over conductive tungsten comprising material 27 and, in the preferred embodiment as shown, contacts material 27. An exemplary preferred material for cap 34 is silicon nitride deposited to an exemplary thickness of from 500 Angstroms to 3,000 Angstroms. Preferably, such gate stack would be fabricated by deposition of the above-described respective layers, followed by photopatterning thereof in a single masking step. Anisotropically etched insulative sidewall spacers 36, for example comprised of silicon nitride or some other insulative material, would be subsequently provided.

Figure 2:
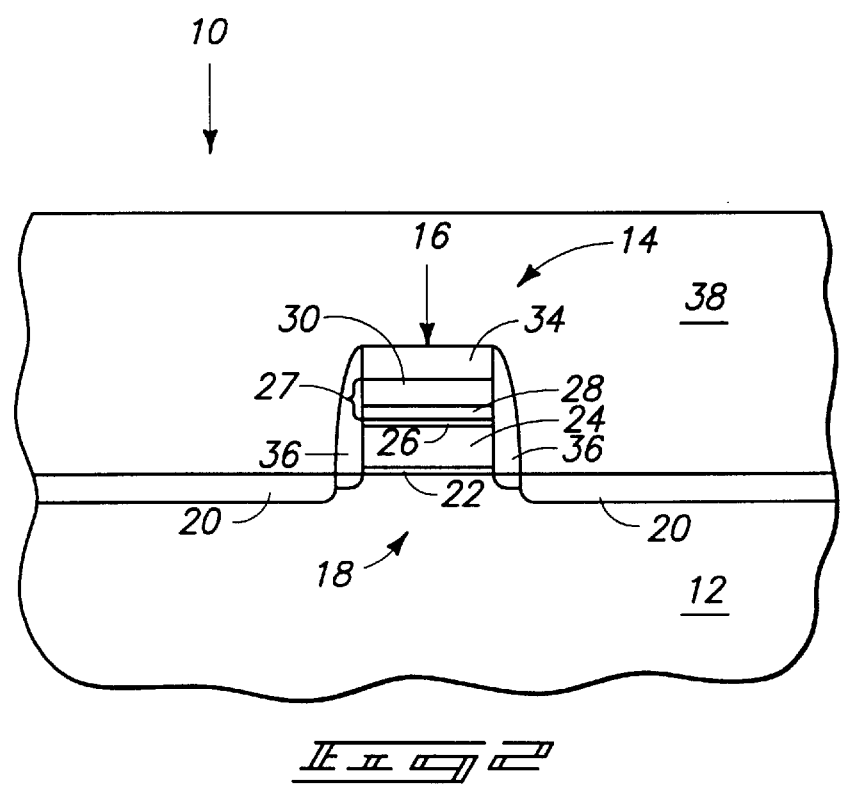
FIG. 2 is a view of the FIG. 1 wafer fragment at a processing step subsequent to that shown by FIG. 1.

Referring to FIG. 2, an insulative material 38 is formed over insulative cap 34. Such is shown as being planarized. An example and preferred material is borophosphosilicate glass (BPSG) deposited to an exemplary thickness range of from 5,000 Angstroms to 30,000 Angstroms. Such provides but one example of forming insulative material over conductive tungsten comprising material 27 and over $W_xSi_yN_z$ comprising material 26, with the insulative material formed thereover in such embodiment comprising both the silicon nitride of cap 34 and the doped silicon dioxide of layer 38.

Referring to FIG. 3, photoresist 40 is formed over insulative material 38/34. A contact mask opening 42 is formed through photoresist 40 over conductive transistor gate construction 16.

Referring to FIG. 4, and using photoresist 40 with contact mask opening 42 as a mask, a contact opening 45 is etched through insulative material 38 and insulative cap 34 to proximate conductive tungsten comprising material 27. As shown in the illustrated and preferred embodiment, such etching preferably is conducted sufficient to expose conductive tungsten comprising material 27. Preferably, such etching constitutes dry etching. An exemplary chemistry for etching BPSG material 38 includes $C_4F_8$, $O_2$, He and Ar in a plasma etching chamber. An exemplary chemistry for etching silicon nitride material 34 includes $CF_4$, $CHF_3$, $CH_2$ and $F_2$ in a plasma etching chamber. Such provides but one example of etching a contact opening into insulative material 38/34 to proximate tungsten comprising material 27.

Figure 5:
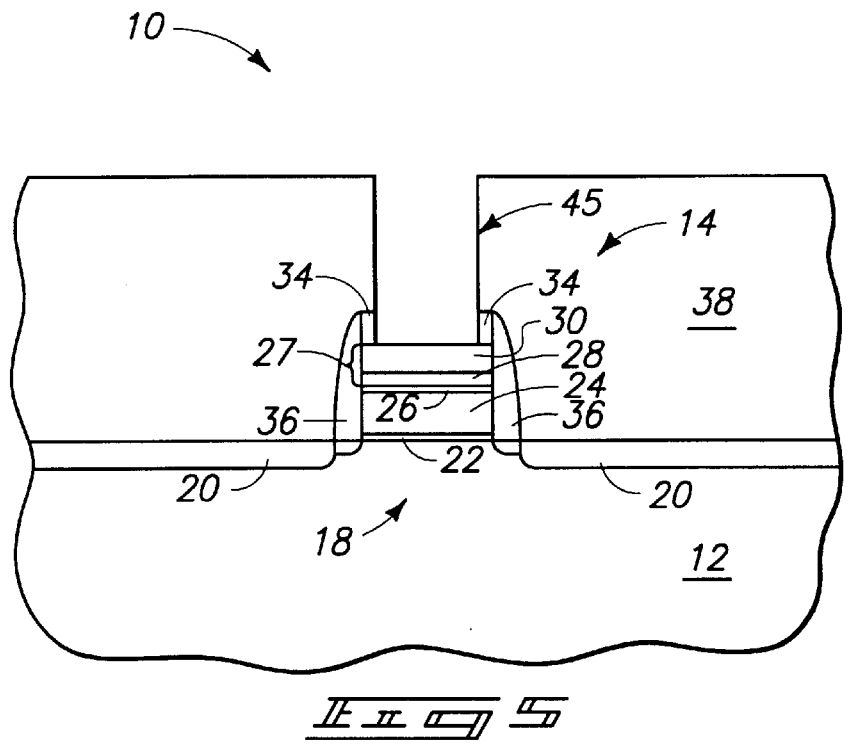
FIG. 5 is a view of the FIG. 4 wafer fragment at a processing step subsequent to that shown by FIG. 4.

Referring to FIG. 5, photoresist 40 has been removed from the substrate. An exemplary process is a dry photoresist strip using oxygen plasma.

Figure 6:
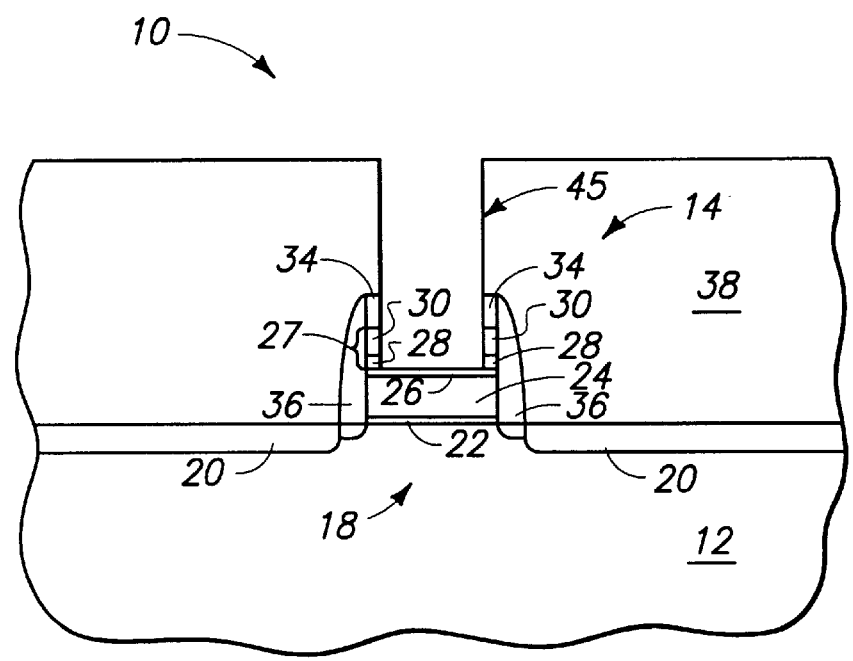
FIG. 6 is a view of the FIG. 5 wafer fragment at a processing step subsequent to that shown by FIG. 5.

Referring to FIG. 6, conductive tungsten comprising material 27 is wet etched through contact opening 45 effective to extend such contact opening to proximate the $W_xSi_yN_z$ comprising material 26. Preferably and as shown, such etching is effective to extend contact opening 45 completely to and exposes $W_xSi_yN_z$ comprising material 26. Some laterally outward undercutting relative to insulative cap 34 might occur during such etching (not shown). Such wet etching preferably utilizes a chemistry comprising $NH_4OH$ and $H_2O_2$. A more specific exemplary chemistry includes deionized water, hydrogen peroxide, and ammonia hydroxide, with exemplary volumetric concentration ranges being from 5:1:1 to 300:1:1 by volume, respectively. Such wet processing is preferably conducted at a temperature from 20° C. to 75° C. at atmospheric pressure. One more specific example comprises a 100:3:2 by volume ratio of the above respective components at 55° C. Typically upon such etching effective to expose $W_xSi_yN_z$ comprising material 26, very little of such material will be etched. Accordingly, in one preferred embodiment, such etching does not appreciably etch $W_xSi_yN_z$ comprising material 26. In the context of this document, "appreciably etch" or "appreciably etched" means an etch amount of at least 50 Angstroms. Accordingly in the described preferred embodiment, the wet etching is ineffective to extend the contact opening to conductively doped semiconductive material 24.

Figure 7:
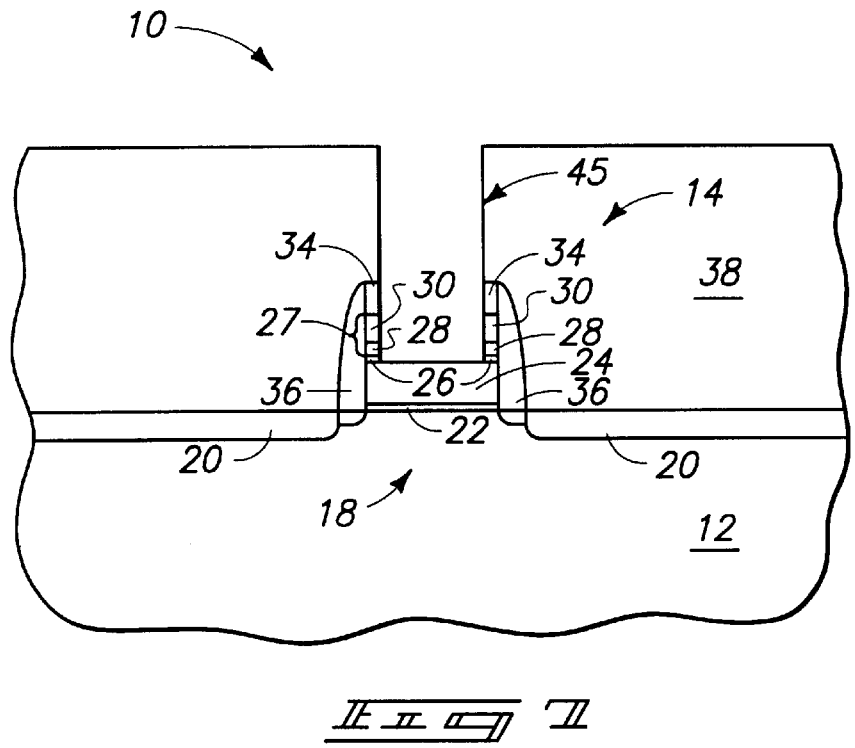
FIG. 7 is a view of the FIG. 6 wafer fragment at a processing step subsequent to that shown by FIG. 6.

Referring to FIG. 7, the contact opening etching is continued into the $W_xSi_yN_z$ comprising material effective to extend contact opening 45 to proximate conductively doped semiconductive material 24. Preferably and as shown, such etching is conducted to be effective to expose conductively doped semiconductive material 24. Preferably, such etching comprises dry etching of at least a majority of $W_xSi_yN_z$ comprising material 26. Also preferably, such dry etching utilizes a chemistry comprising at least one of $NH_3$, $NF_3$, $SF_6$ and a fluorocarbon. Specific examples include:

| | |
|---|---|
| $NF_3$ | nitrogen trifluoride |
| $CF_4$ | tetrafluoromethane |
| $CH_3F$ | fluoromethane |
| $CHF_3$ | trifluoromethane |
| $CH_2F_2$ | difluoromethane |
| $C_4F_8$ | octofluorocyclobutane |
| $C_4F_6$ | perfluorobutadiene |
| $C_3F_8$ | octafluoropropane |
| $C_3F_6$ | hexafluoropropylene |
| $C_2HF_5$ | pentafluoroethane |

-continued

| | |
|---|---|
| $C_2F_6$ | hexafluoroethane |
| $SF_6$ | sulfur hexafluoride |
| $NH_3$ | anhydrous ammonia |

An exemplary preferred etch would be conducted in a single wafer dry strip chamber, for example the Gemini Enhanced Stripper available from FUSION SEMICONDUCTOR SYSTEMS of Rockville, Md. Such exemplary machine utilizes a downstream plasma design with a microwave power source. Exemplary processing is conducted as shown in steps 1–4 below:

| Step | Time (sec) | Pres (Torr) | Temp (° C.) | Power (Watts) | $O_2$ (sccm) | $CF_4$ (sccm) | $N_2H_2$ (sccm) |
|---|---|---|---|---|---|---|---|
| 1 | min | 1 | 300 | off | 2000 | 10 | off |
| 2 | 5 | 1 | 300 | off | 2000 | 10 | off |
| 3 | 30 | 1 | 300 | 1750 | 2000 | 10 | off |
| 4 | 5 | 1 | off | off | 2000 | 10 | off |

The above-depicted first step is intended to achieve steady-state temperature, pressure and gas flows within the etching chamber, and is conducted for a minimum amount of time necessary to achieve such. Once such has been achieved, Step 2 is an exemplary continuing for five seconds of the steady-state conditions. Etching occurs in Step 3 whereby the illustrated time of processing is sufficient in a reduction-to-practice example to completely remove 150 Angstroms to 300 Angstroms of a layer of $W_xSi_yN_z$ material. Step 4 merely comprises an off-step. The above provides but one example specific reduction-to-practice process which was utilized. Further and by way of example only and in no way a means of limitation, exemplary preferred ranges for pressure with such a system are from 0.2 to 5 Torr, temperature from 100° C. to 400° C., and power from 400 Watts to 5,000 Watts. A preferred gas mixture is a combination of $O_2$ and $CF_4$. An exemplary preferred volumetric ratio range when using such gasses is from 1:1 to 600:1, respectively.

In accordance with but one aspect of the invention, such preferred processing provides but one example of etching a contact opening through insulative material and through $W_xSi_yN_z$ material effective to expose the conductively doped semiconductive material, where such etching comprises at least one dry etch, followed by at least one wet etch, followed by at least one dry etch, and where at least one wet etch occurs before etching the $W_xSi_yN_z$ comprising material.

Figure 8:
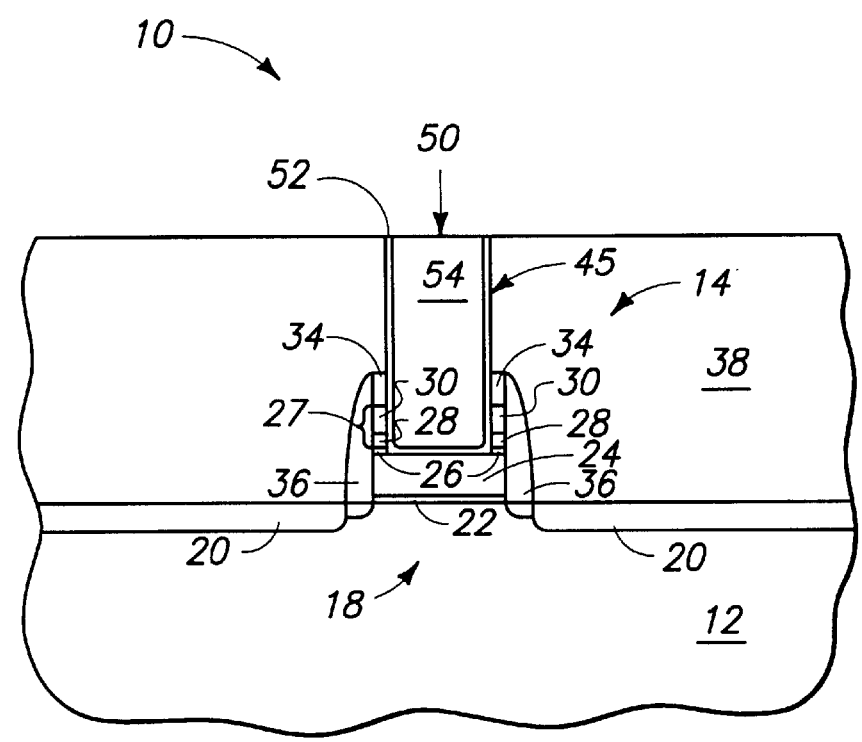
FIG. 8 is a view of the FIG. 7 wafer fragment at a processing step subsequent to that shown by FIG. 7.

Referring to FIG. 8, conductive material 50 is formed within contact opening 45 in electrical connection with conductively doped semiconductive material 24. Exemplary materials include the deposition of a thin titanium layer (i.e., from 150 Angstroms to 500 Angstroms) and a barrier titanium nitride layer (i.e, from 100 Angstroms to 500 Angstroms), and collectively shown as a layer 52. This is preferably followed by the formation of another conductor 54, such as tungsten, within opening 45. Such is then patterned or otherwise planarized back to provide the illustrated preferred embodiment FIG. 8 exemplary construction. Suitable wet or dry cleaning steps can of course be conducted prior to deposition of material 50.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A semiconductor processing method of forming a conductive connection, comprising:

forming a conductive structure over a substrate, the conductive structure comprising a conductively doped semiconductive material and an overlying $W_xSi_yN_z$ comprising material, where each of "x", "y" and "z" is greater than zero;

forming insulative material over the $W_xSi_yN_z$ comprising material of the conductive structure;

etching a contact opening through the insulative material and through the $W_xSi_yN_z$ material effective to expose the conductively doped semiconductive material, the contact opening etching comprising at least one dry etch, followed by at least one wet etch, followed by at least one dry etch; at least one wet etch occurring before etching the $W_xSi_yN_z$ comprising material; and after the contact opening etching, forming conductive material within the contact opening in electrical connection with the conductively doped semiconductive material.

2. The semiconductor processing method of claim 1 wherein the conductive structure comprises a transistor gate.

3. The semiconductor processing method of claim 1 wherein the conductively doped semiconductive material contacts the $W_xSi_yN_z$ comprising material.

4. The semiconductor processing method of claim 1 wherein "x" is from 1 to 6; "y" is from 1 to 6; and "z" is from 1 to 2.

5. The semiconductor processing method of claim 1 wherein the insulative material comprises both silicon nitride and doped silicon dioxide.

6. The semiconductor processing method of claim 1 wherein at least a majority of the $W_xSi_yN_z$ comprising material is dry etched.

7. The semiconductor processing method of claim 1 wherein at least a majority of the $W_xSi_yN_z$ comprising material is dry etched using a chemistry comprising at least one of $NH_3$, $NF_3$, $SF_6$ and a fluorocarbon.

8. The semiconductor processing method of claim 1 wherein at least a majority of the $W_xSi_yN_z$ comprising material is dry etched using a chemistry comprising at least $CF_4$.

9. The semiconductor processing method of claim 1 wherein the $W_xSi_yN_z$ comprising material includes an inner portion and an outer portion, the outer portion having higher atomic concentration of W than the inner portion.

10. The semiconductor processing method of claim 1 wherein neither of the $W_xSi_yN_z$ comprising material or the conductively doped semiconductive material is appreciably etched by the wet etch.

11. A semiconductor processing method of forming a conductive connection, comprising:

forming a conductive structure over a substrate, the conductive structure comprising a conductively doped semiconductive material and a conductive tungsten comprising material overlying the conductively doped semiconductive material, the conductive tungsten comprising material comprising at least one of elemental tungsten, a tungsten alloy, and $WN_v$ where "v" is greater than zero;

forming insulative material over the conductive tungsten comprising material;

etching a contact opening into the insulative material to proximate the conductive tungsten comprising material;

after etching the insulative material, wet etching the conductive tungsten comprising material effective to extend the contact opening to therewithin; and after the wet etching, forming conductive material within the contact opening in electrical connection with the conductively doped semiconductive material.

12. The semiconductor processing method of claim 11 wherein "v" is from 1 to 3.

13. The semiconductor processing method of claim 11 wherein the wet etching utilizes a chemistry comprising $NH_4OH$ and $H_2O_2$.

14. The semiconductor processing method of claim 11 wherein the contact opening etching into the insulative material comprises dry etching.

15. The semiconductor processing method of claim 11 wherein the contact opening etching into the insulative material exposes the conductive tungsten comprising material.

16. The semiconductor processing method of claim 11 wherein the wet etching is effective to extend the contact opening to completely through the conductive tungsten comprising material.

17. The semiconductor processing method of claim 11 wherein the wet etching is ineffective to extend the contact opening to the conductively doped semiconductive material.

18. The semiconductor processing method of claim 11 wherein the conductive tungsten comprising material comprises both elemental tungsten and $WN_v$.

19. The semiconductor processing method of claim 11 wherein the conductive tungsten comprising material comprises an elemental tungsten layer received over and contacting a $WN_v$ comprising layer.

20. A semiconductor processing method of forming a conductive connection, comprising:

forming a conductive structure over a substrate, the conductive structure comprising a conductively doped semiconductive material, a $W_xSi_yN_z$ comprising material overlying the semiconductive material where each of "x", "y" and "z" is greater than zero, and a conductive tungsten comprising material overlying the $W_xSi_yN_z$ comprising material, the conductive tungsten comprising material comprising at least one of elemental tungsten, a tungsten alloy, and $WN_v$ where "v" is greater than zero;

forming insulative material over the conductive tungsten comprising material;

etching a contact opening into the insulative material to proximate the conductive tungsten comprising material;

after etching the insulative material, wet etching the conductive tungsten comprising material through the contact opening effective to extend the contact opening to proximate the $W_xSi_yN_z$ comprising material;

after the wet etching, dry etching the $W_xSi_yN_z$ comprising material effective to extend the contact opening to proximate the conductively doped semiconductive material; and after the dry etching, forming conductive material within the contact opening in electrical connection with the conductively doped semiconductive material.

21. The semiconductor processing method of claim 20 wherein the $W_xSi_yN_z$ comprising material includes an inner portion and an outer portion, the outer portion having higher atomic concentration of W than the inner portion.

22. The semiconductor processing method of claim 20 wherein the conductively doped semiconductive material contacts the $W_xSi_yN_z$ comprising material.

23. The semiconductor processing method of claim 20 wherein the conductive tungsten comprising material contacts the $W_xSi_yN_z$ comprising material.

24. The semiconductor processing method of claim 20 wherein the conductive tungsten comprising material contacts the $W_xSi_yN_z$ comprising material and the conductively doped semiconductive material contacts the $W_xSi_yN_z$ comprising material.

25. The semiconductor processing method of claim 20 wherein the dry etching comprises a chemistry comprising at least one of $NH_3$, $NF_3$, $SF_6$ and a fluorocarbon.

26. The semiconductor processing method of claim 20 wherein the dry etching comprises a chemistry comprising at least $CF_4$.

27. The semiconductor processing method of claim 20 wherein "v" is from 1 to 3.

28. The semiconductor processing method of claim 20 wherein the wet etching utilizes a chemistry comprising $NH_4OH$ and $H_2O_2$.

29. The semiconductor processing method of claim 20 wherein the contact opening etching into the insulative material exposes the conductive tungsten comprising material.

30. The semiconductor processing method of claim 20 wherein the wet etching is effective to extend the contact opening to completely through the conductive tungsten comprising material.

31. The semiconductor processing method of claim 20 wherein the conductive tungsten comprising material comprises both elemental tungsten and $WN_v$, and the wet etching utilizes a chemistry comprising $NH_4OH$ and $H_2O_2$.

32. The semiconductor processing method of claim 20 wherein the conductive tungsten comprising material comprises both elemental tungsten and $WN_v$, the wet etching utilizes a chemistry comprising $NH_4OH$ and $H_2O_2$, and the wet etching is effective to extend the contact opening to completely through the conductive tungsten comprising material.

33. A semiconductor processing method of forming a conductive connection, comprising:

forming a conductive structure over a substrate, the conductive structure comprising a conductively doped semiconductive material, a $W_xSi_yN_z$ comprising material overlying and contacting the semiconductive material where each of "x", "y" and "z" is greater than zero, and a conductive tungsten comprising material overlying and contacting the $W_xSi_yN_z$ comprising material, the conductive tungsten comprising material comprising at least one of elemental tungsten, a tungsten alloy, and $WN_v$ where "v" is greater than zero, an insulative cap being received over the conductive tungsten comprising material;

forming insulative material over the insulative cap;

forming photoresist over the insulative material;

forming a contact mask opening through the photoresist over the conductive structure;

using the photoresist with contact mask opening as a mask, dry etching a contact opening through the insulative material and the insulative cap to expose the conductive tungsten comprising material;

after exposing the conductive tungsten comprising material, removing the photoresist from the substrate;

after removing the photoresist, wet etching the conductive tungsten comprising material through the contact opening effective to extend the contact opening to the $W_xSi_yN_z$ comprising material;

after the wet etching, dry etching the $W_xSi_yN_z$ comprising material effective to extend the contact opening to the conductively doped semiconductive material; and after the dry etching, forming conductive material within the contact opening in electrical connection with the conductively doped semiconductive material.

34. The semiconductor processing method of claim 33 wherein the dry etching the $W_xSi_yN_z$ comprising material comprises a chemistry comprising at least one of $NH_3$, $NF_3$, $SF_6$ and a fluorocarbon.

35. The semiconductor processing method of claim 33 wherein "v" is from 1 to 3.

36. The semiconductor processing method of claim 33 wherein the wet etching utilizes a chemistry comprising $NH_4OH$ and $H_2O_2$.

37. The semiconductor processing method of claim 33 wherein the conductive tungsten comprising material comprises both elemental tungsten and $WN_v$, and the wet etching utilizes a chemistry comprising $NH_4OH$ and $H_2O_2$.

38. The semiconductor processing method of claim 33 wherein the $W_xSi_yN_z$ comprising material includes an inner portion and an outer portion, the outer portion having higher atomic concentration of W than the inner portion.

* * * * *